United States Patent [19]

Parker

[11] Patent Number: 5,242,566

[45] Date of Patent: Sep. 7, 1993

[54] PLANAR MAGNETRON SPUTTERING SOURCE ENABLING A CONTROLLED SPUTTERING PROFILE OUT TO THE TARGET PERIMETER

[75] Inventor: Norman W. Parker, Fairfield, Calif.

[73] Assignee: Applied Materials, Inc., Santa Clara, Calif.

[21] Appl. No.: 928,617

[22] Filed: Aug. 11, 1992

Related U.S. Application Data

[63] Continuation of Ser. No. 731,296, Jul. 16, 1991, abandoned, which is a continuation of Ser. No. 512,719, Apr. 23, 1990, abandoned.

[51] Int. Cl.[5] .............................................. C23C 14/35
[52] U.S. Cl. .............................. 204/298.2; 204/192.12
[58] Field of Search ...................... 204/192.12, 298.2

[56] References Cited

U.S. PATENT DOCUMENTS

| 4,444,643 | 4/1984 | Garrett | 204/298.2 |
| 4,498,969 | 2/1985 | Ramachandran | 204/192.12 |
| 4,552,639 | 11/1985 | Garrett | 204/298.37 |
| 4,714,536 | 12/1987 | Freeman | 204/298.2 |

FOREIGN PATENT DOCUMENTS

| 0211412 | 2/1987 | European Pat. Off. | 204/298.2 |
| 0248244 | 12/1987 | European Pat. Off. | 204/298.2 |
| 0365249 | 4/1990 | European Pat. Off. | 204/298.2 |
| 2707144 | 2/1977 | Fed. Rep. of Germany | 204/298.2 |

| 61-291971 | 12/1986 | Japan | 204/298.2 |

OTHER PUBLICATIONS

Sheet of Drawings for FIGS. 1A and 1B, illustrating the CONMAG 1 and CONMAG II systems of Varian Associates.

Sheet of drawings for FIG. 2, illustrating a 1000 Series sputtering system by Anelva.

Copending application (as cited in patent application Ser. No. 07/512,719); entitled "Planar Magnetron Sputtering Source Producing Improved Coating Thickness Uniformity, Step Coverage and Step Coverage Uniformity" Inventor: Avi Tepman; Filed on Mar. 30, 1990 under U.S. Ser. No. 07/502,391.

Primary Examiner—Aaron Weisstuch
Attorney, Agent, or Firm—John A. Frazzini

[57] ABSTRACT

A planar magnetron sputtering source having a pair of pole pieces configured to produce a uniform coating, excellent step coverage and excellent step coverage uniformity of a wafer. Between the two pole pieces is a gap within which the magnetic field and electric field produce an electron trap. The shape of the gap produces a depth of sputter profile in the target that results in the uniform coating, excellent step coverage and excellent step coverage uniformity. The outer pole piece is bowl-shaped cross-section with a rim substantially coplanar with a planar inner pole piece.

22 Claims, 6 Drawing Sheets

PLANAR MAGNETRON SPUTTERING SOURCE ENABLING A CONTROLLED SPUTTERING PROFILE OUT TO THE TARGET PERIMETER

This is a continuation of U.S. application Ser. No. 07/731,296 filed Jul. 16, 1991, now abandoned, which is a continuation of U.S. application Ser. No. 07/512,719 filed Apr. 23, 1990, now abandoned.

BACKGROUND OF THE INVENTION

This invention relates in general to sputtering deposition and relates more particularly to the problems of thickness uniformity and step coverage of coats produced by planar magnetron sputtering.

In a sputtering device, a target is subjected to bombardment by high energy ions to dislodge and eject material from the target onto a workpiece, such as a semiconductor wafer. In general, the target and wafer are placed into a vacuum chamber that is evacuated to a pressure typically $3 \cdot 10^{-4}$ Torr and below. In physical sputtering, the bombarding particles are generally ions of a heavy, inert gas such as argon and are accelerated to high velocities in directions that are substantially perpendicular to an exposed front surface of the target.

For industrially acceptable sputtering rates, it is important to produce a relatively high density of ionized bombarding particles. The most cost-effective source of ions is a low pressure glow discharge. In electrically biased glow discharge sputtering devices, the wafer is mounted on a pedestal that is biased as the sputtering reactor anode or separate anode and the target is biased as the sputtering reactor cathode. This produces at the target an electric field that is substantially perpendicular to the exposed front surface of the target and that accelerates the ions into the exposed surface of the target along trajectories that are substantially perpendicular to the front surface of the target.

Collisions between high energy electrons and gas molecules ionize some of these neutral particles to replace the ions that bombard the target. This ionization produces within the reactor chamber a conductive plasma body that is separated from the cathode and anode by free-electron deficient regions called plasma sheaths. Because the plasma body is conductive, the accelerating electric fields are substantially restricted to the plasma sheath regions at the wafer and target.

In a planar magnetron sputtering device, ion densities at the target are enhanced by producing within the target sheath a magnetic field that helps trap and direct electrons near the target. The increased electron density in these traps increases the rate of ion generation within these regions, thereby increasing the ion density at the target. Because the electric field $\vec{E}$ within the target sheath is substantially perpendicular to the exposed surface of the target, in those regions where the magnetic field $\vec{B}$ is substantially parallel to the target surface, the $\vec{E} \times \vec{B}$ drift field pushes electrons parallel to the surface of the target. The electrons are trapped by configuring the magnetic fields so that these regions in which the $\vec{E} \times \vec{B}$ drift field is parallel to the target surface form closed paths within which the electrons are then trapped. This configuration of the drift fields is achieved by cooperative selection of the locations and shapes of magnetic fields.

Typically, the target material is attached to a backing plate to mount the target within the reactor. It is important that sputtering of the target does not reach this backing plate because particles sputtered from the backing plate would contaminate the integrated circuit fabrication process. Therefore, a target is typically replaced before sputtering of the backing plate can possibly happen. Unfortunately, this results in the replacement of targets that still contain a significant fraction of the original target material.

Because many targets are composed of an expensive material, such as gold, and because of the significant expense of lost production time to replace a target, it is important to maximize the amount of sputtering that is allowed before the target must be replaced. In German Offenlegungsschrift 27 07 144 entitled Kathodenzerstaeubungsvorrichtung filed by Sloan Technology Corp on Feb. 18, 1977, magnet/magnetic pole assemblies are swept either longitudinally in x- and y- directions or off-axis pole assemblies are swept radially about a rotation axis to produce a pattern of target sputter that has an increased time-averaged uniformity of sputter.

Although there are clear cost benefits to improving the efficiency of utilization of a target, it is also important to produce wafer coatings that have very uniform thickness, excellent step coverage and excellent step coverage uniformity. This is especially true in submicron integrated circuit fabrication. When a layer is patterned, if portions of the layer are thicker than other portions, then each of these portions will achieve pattern completion at different times. If some regions are over-etched to achieve etch completion in other regions, then linewidths in the over-etched regions will be reduced below designed values. The layer uniformity and step coverage of these systems are therefore inadequate for most sputtering applications in current state of the art circuits. Thickness variations on the order of 25% can result from the above-discussed process, making it suitable substantially only for deposition of the back ground plane of the wafer.

Uniform coatings are also important for preserving accurate mask alignment. The alignment marks typically consist of raised features on a wafer so that they remain visible even after deposition of several layers on the wafer. Asymmetric coating at alignment marks can produce spurious results in the apparent location of these marks, thereby misaligning subsequent patterning.

SUMMARY OF THE INVENTION

In accordance with the illustrated preferred embodiment, a planar magnetron sputtering system is presented in which the shape of a pair of pole pieces provides excellent coating uniformity, step coverage and step coverage uniformity and improved target utilization efficiency. The shape of these pole pieces in a cross-section parallel to the surface of the target is motivated by an analysis of the angular distribution of sputtered particles as they leave the target and an analysis of the distribution of sputtered particles needed to produce uniform coatings, excellent step coverage and excellent step coverage uniformity. The shape of these pole pieces in a cross-section perpendicular to the surface of the target is motivated by both target utilization efficiency and the uniformity of coating thickness, step coverage and step coverage uniformity.

In FIG. 1, the path of a sputtered particle 16 from a target 15 to a wafer 14 is illustrated. A hole 11 on the wafer surface is shown. If incident particles arrive at hole 11 at too oblique an angle $\theta$, then the top corner 12 of one sidewall of hole 11 can shadow the base 13 of the opposite sidewall of that hole. Thus, for a hole of width W and depth D, only the particles arriving from angles $\theta$ in the range from zero to arctan W/D are effective in producing a coating on the left sidewall. Similarly, only the particles arriving from angles $\theta$ in the range from zero to arctan W/D are effective in producing a coating on the right sidewall. Excellent step coverage requires that, over the entire wafer, there is a sufficient flux of particles from both sides of a hole, trench or line that both sides of such feature will be coated. Excellent step coverage uniformity requires that, throughout the wafer, there is approximately the same flux from each side of every hole, trench and line and that the ratio between the thickness on flat surfaces to the thickness on sidewalls is a reasonably small number on the order of 5 or less.

In physical sputtering (as opposed to chemical sputtering) it is theorized that the incident bombarding particles produce within the target a collisional cascade having a statistical distribution of momentum directions. This statistical process ejects target particles in random directions so that there is cosine angular distribution of ejection of particles from the target. Empirical tests show that this distribution does indeed result for a sputtering potential on the order of 2000 ev and that for larger sputtering potentials this distribution skews somewhat toward directions more perpendicular to the target and for smaller sputtering potentials this distribution skews somewhat toward directions more parallel to the target surface.

As illustrated in FIG. 2, at a point P of the wafer, the intensity $I(P,\theta,\phi)$ of particles incident within a solid angle $d\theta d\phi$ centered at the angular polar coordinates $\theta,\phi$ is substantially equal to the product of the following factors: (1) the area $r^2 \cdot \tan\theta \cdot d\theta d\phi$ of the portion of the target within the angular ranges $d\theta$ and $d\phi$; (2) the $r^{-2}$ factor of decrease in intensity for a spherically symmetric distribution of flux; (3) the $\cos(\theta)$ projection factor to account for the angle $\theta$ between the normal to the wafer and the incident flux vector for these particles; and (4) the rate S of sputtering from this infinitesimal area of the target, determined by the time-averaged local plasma intensity. Thus, if the effects of gas scattering are neglected, then the intensity of particles incident on point P, within this solid angle, is:

$$I(P,\theta,\phi) = S(Q) \cdot \sin\theta \cdot d\theta d\phi \quad (1)$$

where Q is the point of the target from which the sputtering produces these incident particles.

When S(Q) is substantially constant, as is the objective of those prior art patents discussed above that seek to maximize the use of the target, this flux at point P is just the solid angle subtended at point P of the wafer by this infinitesimal area of the target. Therefore, for these devices, the total intensity $I(P) = \int I(P,\theta,\phi) d\theta d\phi$ of particles on a point P of the wafer is equal to the solid angle subtended at point P by the target. In general, the wafer is centered under and is parallel to the target so that the maximum subtended solid angle occurs when point P is located at the center of the wafer. Therefore, these prior sputtering systems produce a coating thickness that is definitely not uniform over the wafer. Because of the axial symmetry of the wafer/target system, the thickness is a function only of the radial distance $\rho_w$ of point P from the center $C_w$ of the wafer and has the shape illustrated in FIG. 3.

Because the target has a finite radius $R_t$, for any given angle $\phi$ about the vertical line through point P, there is a maximum value of azimuthal angle $\theta$ for which the flux is nonzero. For larger values of $\theta$, the cone of solid angle $d\theta d\phi$ in the direction $\theta,\phi$ does not intersect the target so that no particles can be sputtered from this direction. Therefore, the angular distribution of particles at a point P is a function of the distance of point P from axis A, the radius $R_t$ of the target, the radius $R_w$ of the wafer, the distance D between the wafer and the target, and the sputtering intensity distribution within the target. For a spatially uniform sputter rate from the target, the rate of sputter deposition onto point P from the direction of axis A will increase with the distance of point P from axis A and the rate of sputter from the direction of the closest point on the perimeter of the target will decrease with the distance of point P from axis A. Therefore, prior systems that produce uniform sputtering of the target will have poor step coverage uniformity.

Because of the axial symmetry of the system about an axis A that passes through the centers $C_t$ of the target and $C_w$ of the wafer, the deposited intensity $I(P,\theta,\phi)$ will retain axial symmetry only if S is a function only of the radial distance $\rho_t$ from the center $C_t$ of the target. That is, $S = S(\rho_t)$ and is zero for $\rho_t$ greater than the radius $R_t$ of the target. For this choice, at the point P located at the radial distance $\rho_w$ from the center of the wafer, the total intensity I(P) is independent of the angular position $\phi_w$ of point P and is therefore a function only of $\rho_w$. Mathematically, $I(\rho_w)$ is the integral over all $\theta$ and $\phi$, where, for each value of $\theta$ and $\phi$, point Q is located to produce incident particles in this direction. Because of the rotational symmetry, this can be evaluated for the special case of a point on the wafer at $x = \rho_w$ and $y = 0$, as illustrated in FIG. 4:

$$I(\rho_w) = \int_T [S(\{u^2 + v^2\}^{1/2}) \cdot D \cdot \{(\rho_w - u)^2 + v^2 + D^2\}^{-3/2}] du dv \quad (2)$$

where D is the spacing between the wafer and the target, $\int_T$ represents the integral over the (u,v) range within the target, and $S(\{u^2+v^2\}^{\frac{1}{2}})$ is zero for $\{u^2+v^2\}^{\frac{1}{2}}$ greater than the target radius $R_t$. The integrand is the product of the sputtering intensity distribution (i.e., the distribution of the rate of sputtering particles from the target) at point (u,v,D), the cosine of the angle between the normal to the wafer and the vector connecting points (u,v,D) and $(\rho_w,0,0)$, and the $r^{-2}$ factor characteristic of a spherically symmetric flux.

To produce a substantially uniform coating thickness on the wafer, $S(\rho_t)$ must have the ideal functional dependence $S_i(\rho_t)$ as illustrated in FIG. 5. This sputtering profile can be approximated by etching in the target a set of N axially symmetric grooves, where the kth groove produces a sputtering intensity distribution $S_k(\rho_t)$ and the total actual sputtering rate $S_a(\rho_t)$ is:

$$S_a(\rho_t) = \sum_{k=1}^{N} S_k(\rho_t) \quad (3)$$

This is illustrated graphically in FIGS. 6A and 6B for the case N=3. FIG. 6A shows the sputtering intensity distribution for each of the three grooves and FIG. 6B compares the total actual sputtering intensity distribution with the ideal sputtering intensity distribution, illustrating that a reasonable approximation to the ideal distribution can indeed be produced sputtering a set of three concentric circular grooves into the target of appropriate radius and depth.

In copending patent application U.S. Ser. No. 07/502,391 filed Mar. 30, 1990, a sputtering system is presented in which the shape of a pair of pole pieces produces greatly improved coating thickness uniformity, step coverage and step coverage uniformity. Between the two pole pieces is a gap within which the magnetic field and electric field produce an electron trap. The shape of the gap causes a depth of sputter profile in the target that produces excellent coating uniformity, step coverage and step coverage uniformity. This depth of sputter profile exhibits a plurality of peaks, the largest of which is the farthest from the axis of rotational symmetry of the sputter pattern.

Unfortunately, although the resulting coating exhibits excellent uniformity properties, the fractional utilization of the target is undesirably low. In particular, the depth of sputter profile in the target in this system exhibits an undesirably low amount of sputter near the center of the target and within a relatively wide band at its outer perimeter. Because an unsputtered band of width W at radius r represents an area approximately equal to $2\pi rW$, the occurrence of this band at the largest possible value of r results in a significant fraction of potentially useful target being unsputtered. If the largest sputter peak could be moved significantly closer to the outer perimeter of the target, then the fractional usage of the target would be significantly increased.

The formation of selected grooves in the target is achieved by means of a specially designed magnetron source having pole pieces that produce the sputtering intensity $S_d(\rho_t)$. As is taught in the copending patent application U.S. Ser. No. 07/502,391 entitled Planar Magnetron Sputtering Source Producing Improved Coating Thickness Uniformity, Step Coverage And Step Coverage Uniformity, filed by Avi Tepman on Mar. 30, 1989, pole pieces that achieve this actual sputtering profile for $N=2$ are illustrated in FIG. 7. This design is easily adapted for other values of N.

This design utilizes the facts that, in a magnetron sputtering system, the majority of sputtering occurs where the magnetic field is approximately parallel to the target and that the regions where this occurs must form closed paths within which electrons can be trapped to enhance ion generation and the associated local sputtering rate. The pole pieces and magnets are rotated about a central axis A of the target to produce a circularly symmetric sputtered pattern of grooves in the target.

The regions where the magnetic field is substantially parallel to the target occur along a track between the two pole pieces. The pole pieces are designed so that this track consists of three regions: (1) a first approximately circular arc of radius $R_1$ centered on axis A; (2) a second approximately circular arc of radius $R_2$ centered on axis A; and (3) two sections that couple the first and second arcs to form a closed path. At axis A, the first arc subtends an angle $\alpha_1$ and the second arc subtends an angle $\alpha_2$. As these pole pieces are rotated about axis A, 2 grooves of radius $R_1$ and $R_2$ are produced having a relative depth of $\alpha_1/\alpha_2$. The sections of the track that connect these two arcs produce sputtering of the region between these two grooves, thereby flattening the sputtered region between these two grooves. The arc lengths and radii of the first and second sections of the track are selected to optimize the flatness of coating thickness sputtered from the target onto a wafer.

Excellent step coverage requires adequate thickness of coverage over the entire step and sufficient sputter deposition onto both sidewalls of a line, trough or hole that both sidewalls are adequately coated. Excellent step coverage uniformity requires substantial equality of coverage of both upward and downward steps so that asymmetric coverage of a step does not result. Asymmetric coverage of alignment marks can produce misalignment of subsequent layers. Asymmetric coverage of underlying features can produce misalignment of those features with features in subsequent layers. The monotonically increasing form of the sputtering rate $S(\rho_t)$ increases the fraction of obliquely incident particles incident on point P in directions toward the center of the wafer, thereby improving step coverage uniformity. The uniformity of step coverage is also a function of the ratio $R_t/R_w$. This ratio and the sputtering rate $S(\rho_t)$ can be selected to achieve excellent step coverage uniformity and excellent coating thickness uniformity.

Because there is a single trap region track produced, there is no instability as to which of multiple possible plasma regions actually produce a plasma, as is the case when more than one trap region track is produced. This instability occurs because of the nonlinear nature of the plasma. If one part of the plasma produces an extra amount of ionization, it will produce an increased conductivity that draws more current into that region, producing even more ionization. Thus, this single trap region avoids the need for a separate power source for each trap region.

As is illustrated in FIG. 7, in copending patent application U.S. Ser. No. 07/502,391, the magnetic field is produced by a set of horseshoe magnets 73 each of which has a first polarity pole attached to a first pole piece 71 and having its opposite polarity pole attached to the second pole piece 72. In gap 74 between the pole pieces, a trap region with a centerline indicated by dashed line 75 is produced by the magnetic field between the pole pieces and the electric field that accelerates ions into the target. These pole pieces are rotated about an axis A perpendicular to the target and to a plane containing pole pieces 71 and 72 so that a cylindrically symmetric sputter pattern is produced in the target. This particular shape produces a sputter intensity pattern having a pair of peaks analagous to the leftmost pair of peaks illustrated in FIGS. 6A and 6B. The actual depth of sputter distribution is illustrated in FIG. 8.

Unfortunately, as can be seen from FIG. 7, only a few of these horseshoe magnets can be coupled between the two pole pieces. A large fraction of the area of the outer pole piece is uncovered by any magnet. More significantly, the thickness T of the magnet forces the distance D of closest approach of trap region 75 to a sidewall 77 of the magnetron to be greater than T.

These and other objectives and advantages of the present invention will become clear from the detailed description given below in which a preferred embodiment is described in relation to the drawings. The detailed description is presented to illustrate the present invention, but is not intended to limit it.

Figure 1:
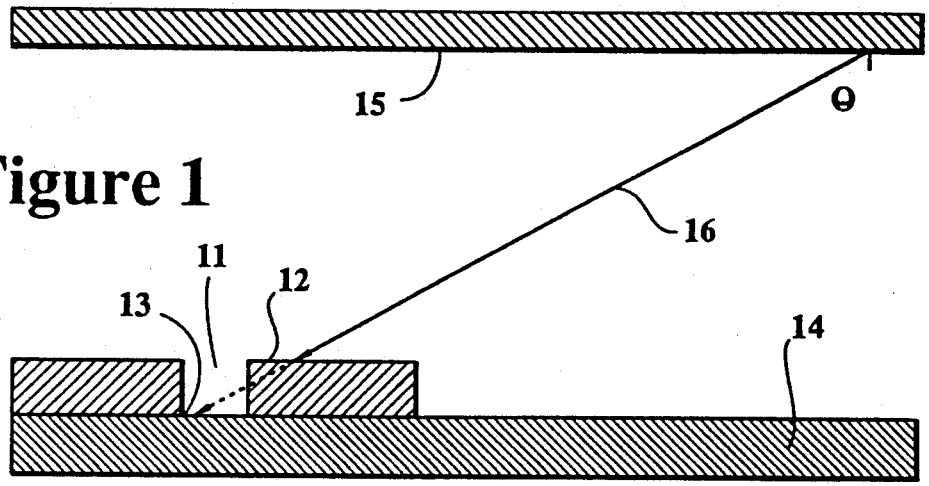
FIG. 1 illustrates shadowing that can occur for highly oblique incident particles.
Figure 2:
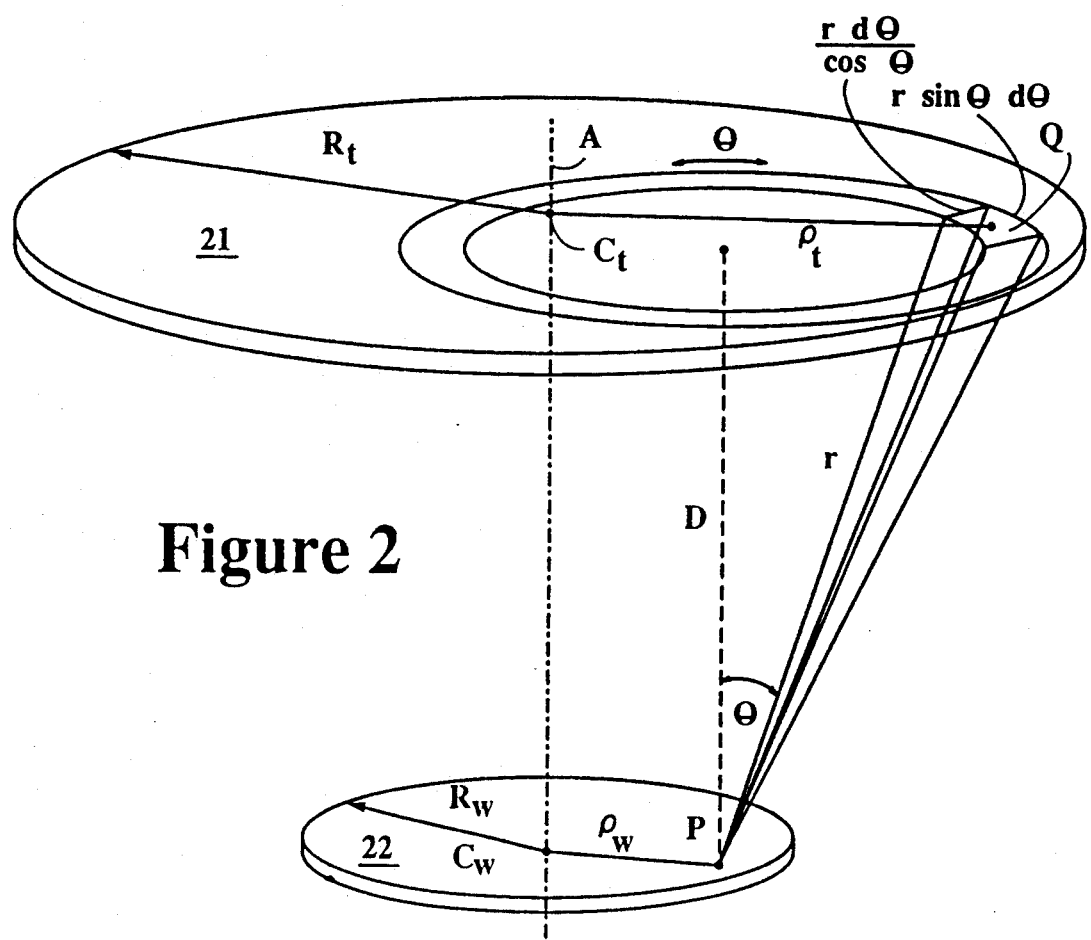
FIG. 2 illustrates the factors that determine the angular distribution of sputtered particles onto a wafer.
Figure 3:
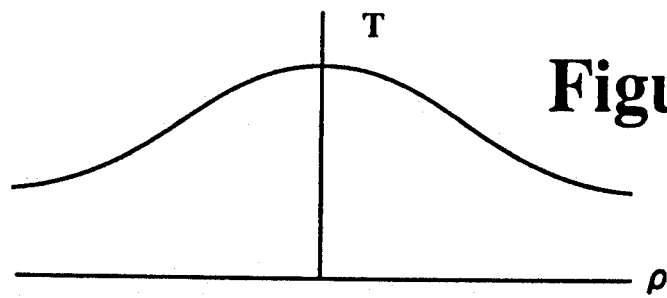
FIG. 3 illustrates the radical distribution of sputter-deposited particles on a wafer when the target is substantially uniformly sputtered.
Figure 4:
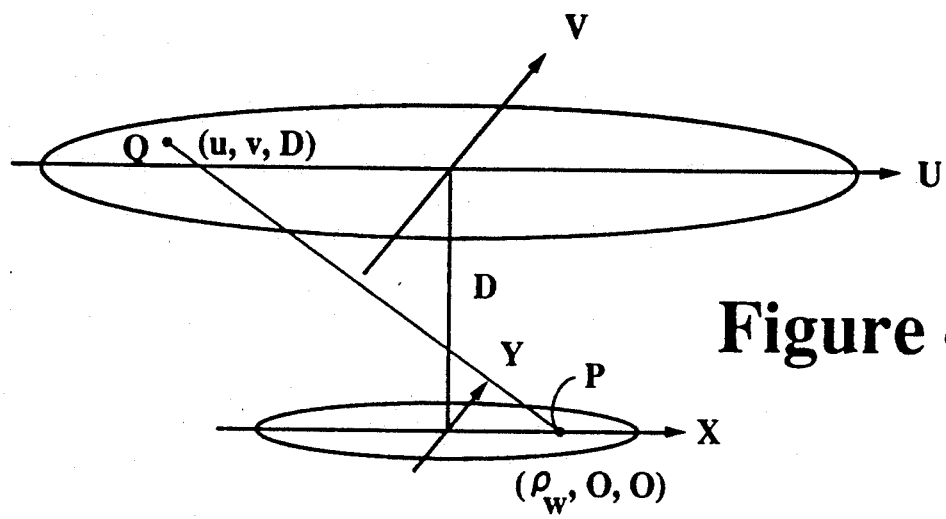
FIG. 4 illustrates the calculation of the total flux at a point of the wafer at a radius $\rho_w$.
Figure 5:
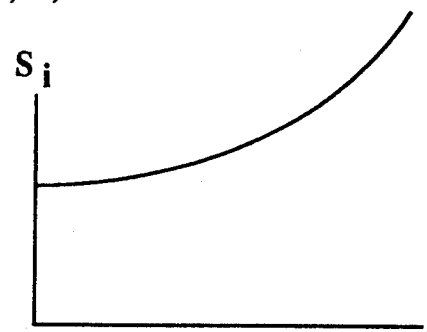
FIG. 5 illustrates the ideal radical dependence on sputter intensity needed to achieve a substantially uniform sputtered coating thickness.

In the Figures, the first digit of a reference numeral indicates the first Figure in which is presented the element indicated by that reference numeral.

DESCRIPTION OF THE PREFERRED EMBODIMENT

Figure 9C:
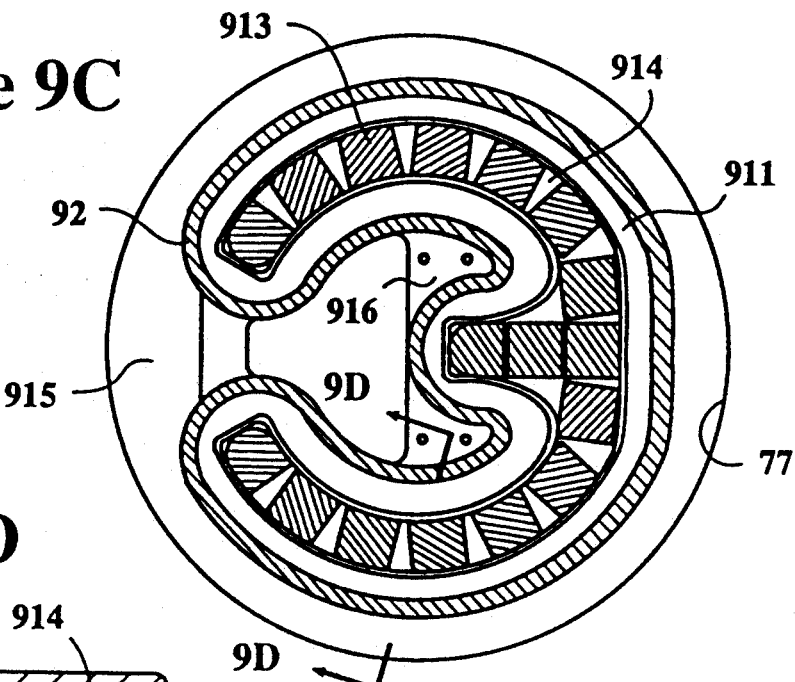
FIG. 9C is a top cross-sectional view, taken substantially along the line 9C—9C in FIG. 9B, of the magnetron of FIG. 9B illustrating the locations of the magnets.
Figure 9D:
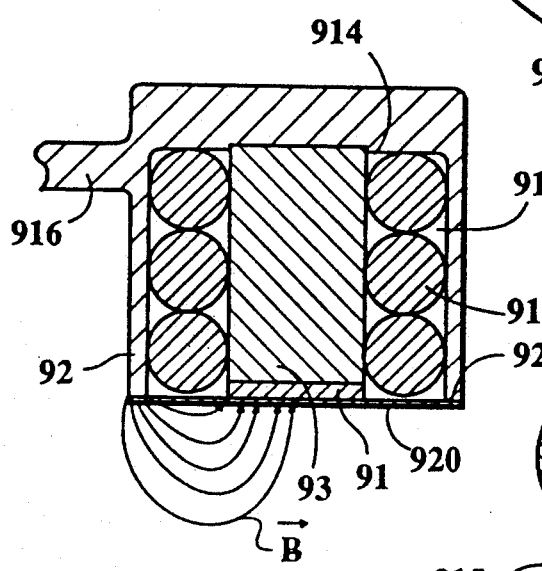
FIG. 9D is a side cross-sectional view, taken substantially along the line 9D—9D in FIG. 9C, of the pole pieces illustrating the structure of the outer pole piece, inner pole piece and permanent magnets.
Figure 9E:
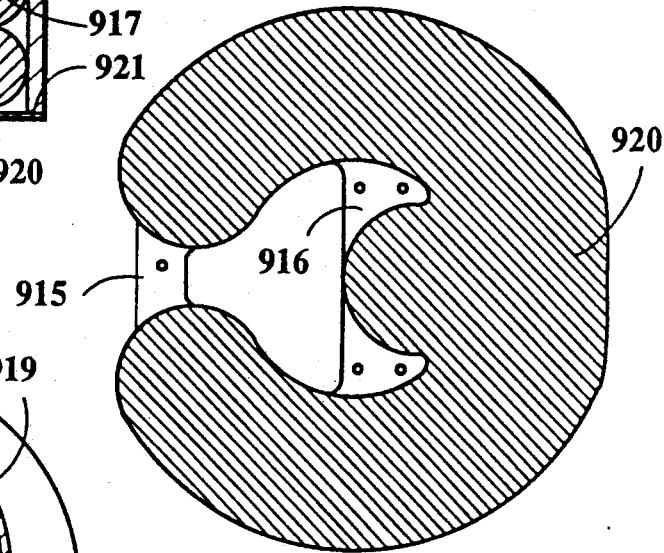
FIG. 9E is a top cross-sectional view, taken substantially along the line 9E—9E in FIG. 9B, through a sealing plate of the pole piece/magnet assembly.
Figure 9A:
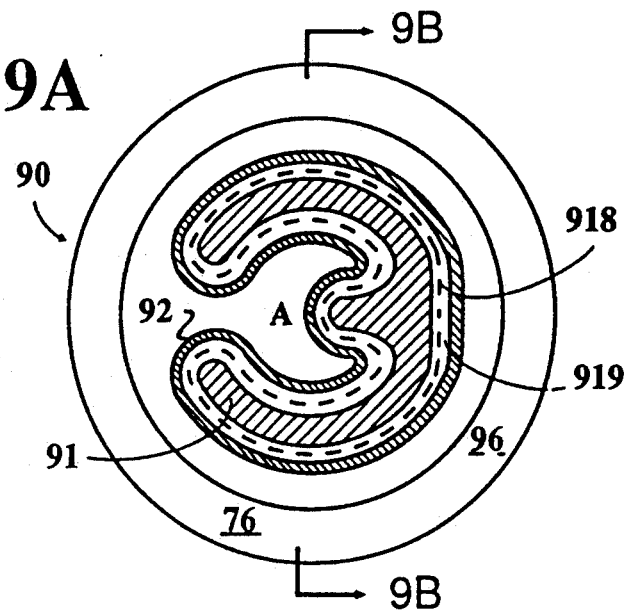
FIG. 9A is a top cross-sectional view, taken substantially along the line 9A—9A in FIG. 9B, of a magnetron in which the shapes of a pair of pole pieces extend the outer sputtering peak much closer to the outer perimeter of the target than is achieved by the pole pieces of the magnetron illustrated in FIG. 7.
Figure 9B:
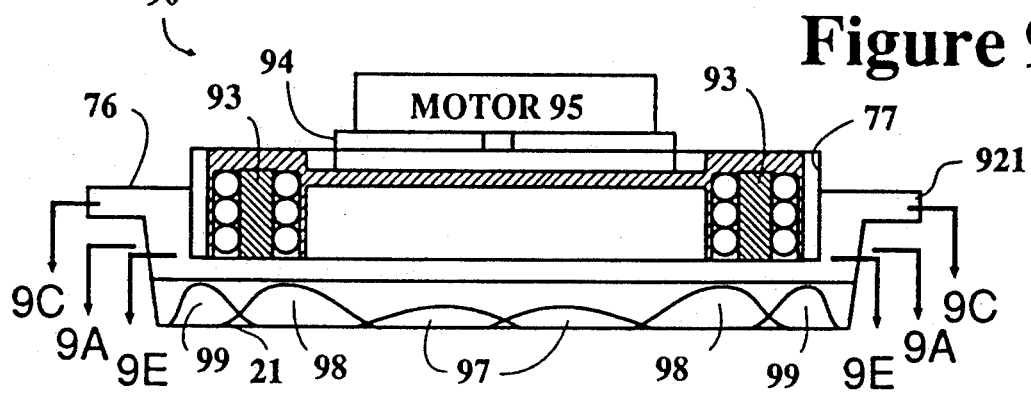
FIG. 9B is a side cross-sectional view, taken substantially along the line 9B—9B in FIG. 9A, of the magnetron of FIG. 9A.
Figure 10:
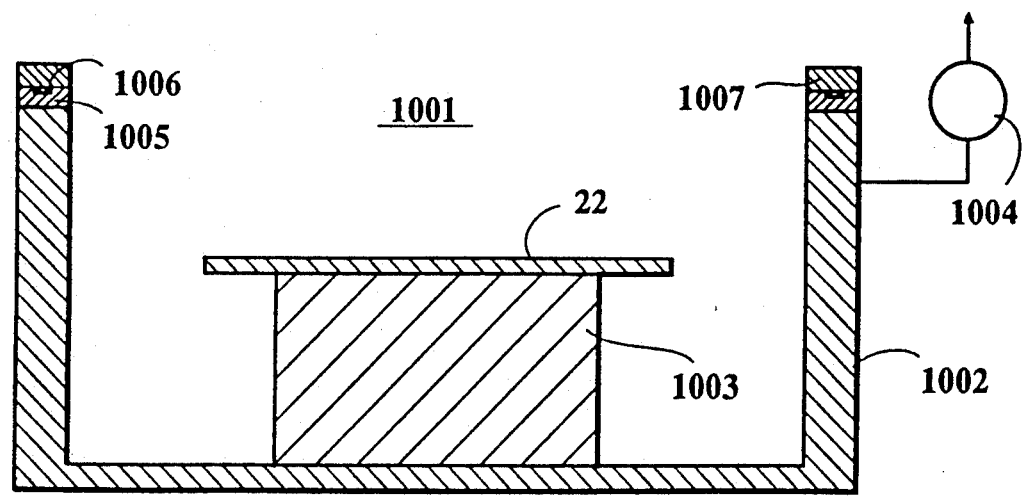
FIG. 10 illustrates a sputtering system vacuum chamber utilizing the magnetron assembly of FIGS. 9A—9E, wherein the vacuum chamber is shown in juxta-position with the magnetron assembly of FIG. 9B, which serves as a lid of the chamber.

FIGS. 9A and 9B respectively illustrate a top cross-sectional view and a side cross-sectional view of a magnetron assembly 90 having ferromagnetic pole pieces 91 and 92 that enable the production of sputtered coatings having uniform thickness, excellent step coverage and excellent step coverage uniformity. The magnetron assembly is utilized as the lid of a sputtering system vacuum chamber such as that in FIG. 10.

A top cross-section is also referred to herein as the "parallel cross-section" because this cross-section lies in a plane that is parallel to the target. Similarly, a side cross-section is also referred to herein as the "perpendicular cross-section" because it is perpendicular to the target.

A typical sputtering system includes a vacuum chamber 1001 within which a high vacuum is produced. Chamber 1001 is typically enclosed by sidewalls 1002 and magnetron assembly 90 that also functions as the lid for the vacuum chamber. The sidewalls are often formed of a metal such as stainless steel or aluminum. Attached to the underside of the lid is a target 21 formed of a material that is to be sputtered onto a wafer 22. In the bottom of chamber 1001 is a pedestal 1003 on which the wafer is placed during processing. A voltage source 1004 produces a dc or rf potential difference between walls 1002 and magnetron assembly 90 to accelerate ions into the target to sputter target particles onto the wafer. A metal ring 1005 is attached to the top of the sidewalls and includes a groove in which is inserted a rubber O-ring 1006. This O-ring forms a vacuum seal between metal ring 1005 and a ring 1007 formed of a nonconductive material such as teflon or a ceramic. Nonconductive ring 1006 enables a voltage difference to be produced between sidewalls 1002 and magnetron assembly 90. Because of the heat generated by the impact of high energy ions on the target, a coolant system, such as water-cooled motor mounting plate 94, is thermally connected to the target. To enhance cooling of the target, a backing plate 921 within the magnetron assembly is formed of a highly heat-conductive material such as copper.

In magnetron sputtering systems, a magnetic field is produced within chamber 1001 adjacent to target 21 to increase the generation of ions near the target by trapping electrons near the target. This electron trap typically consists of one or more closed loop regions within which the magnetic field is substantially parallel to the target. In these regions, the electric field and magnetic field are substantially perpendicular and produce an $\vec{E} \times \vec{B}$ drift field that pushes electrons parallel to the surface of the target. Because these regions form closed loops, the electrons become trapped near the target, thereby effectively producing ions that impact the target. In this sputtering system, magnetron assembly 90 produces these electron trap regions.

As is illustrated in FIGS. 9A and 9B, magnetron assembly 90 includes pole pieces 91 and 92, magnets 93, a sealing rim 76, target 21, and a motor mounting plate 94 that couples pole pieces 91 and 92 to a motor 95. All of these magnets have the same polarity magnetic pole in contact with pole piece 91. Although electromagnets can be used to produce a magnetic field between the pole pieces, permanent magnets are preferred because of their greater field strength.

Figure 11:
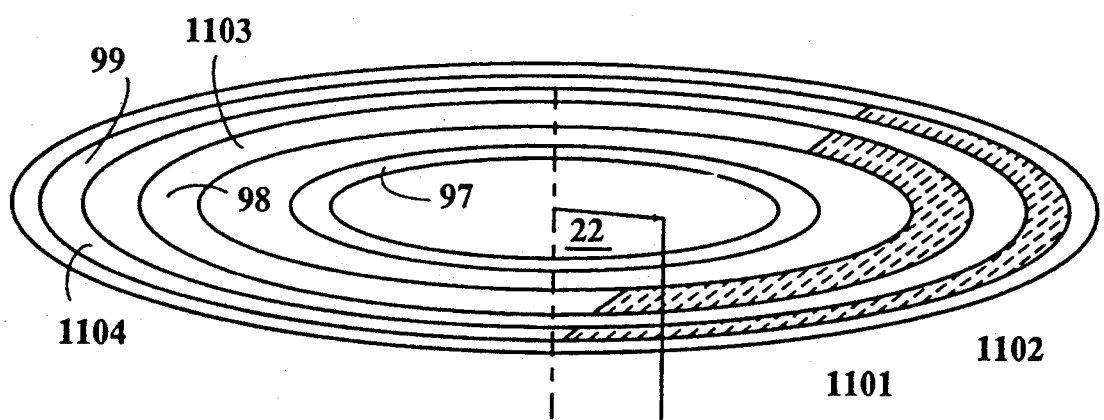
FIG. 11 illustrates the portion of grooves 98 and 99 that produce a radially inward flux of particles on point P of the wafer.

Motor 95 rotates pole pieces 91 and 92 and magnets 93 about an axis A centered over wafer pedestal 1003 to produce a time averaged sputtering pattern that is circularly symmetric. As will be discussed in greater detail below, this rotation produces in target 21 circular sputtered grooves 97, 98 and 99 that are centered on axis A. The width, depth and spacing of these grooves relative to axis A are chosen to produce very uniform coating thicknesses on wafer 22. Because grooves 98 and 99 produce a large number of oblique ions onto the entire target and these ions have all possible lateral components (i.e., all possible vector components parallel to wafer 22), excellent step coverage results throughout the wafer for all orientations of steps. In FIG. 11, it can be seen that the portions 1101 of groove 98 and 1102 of groove 99 produce a flux of ions having a radial component inward toward axis A. The portions 1103 of groove 98, 1104 of groove 99 and all of groove 97 produce a flux of ions having a radial component outward from axis A. Because grooves 98 and 99 are deeper and longer than groove 97, and are closer to points P than most of groove 97 and most of portions 1103 and 1104, the flux from portions 1101 and 1102 can be as large as from these other sources. The radii of groove 97, groove 98, groove 99, target 21 and the spacing between wafer 22 and target 21 are chosen in conjunction with the widths and depths of these grooves to produce substantially constant layer thickness and maximum step coating uniformity over the entire wafer.

The uniformity of the coating thickness is measured as the variability in thickness as a fraction of the average thickness. The parameters of the pole pieces are selected to minimize this fractional change in thickness. The step coverage is measured as follows. At a hole or trench, the minimum thickness of coating is measured along the vertical height of each of a pair of opposite side walls. The ratio of the minimum side wall thickness to the film thickness on the wafer surface is the fractional step coverage of that hole or trench. The step coverage uniformity is measured as the variability of this ratio as a fraction of the average value of this ratio. A pair of pole pieces that achieve an optimized coating are illustrated in FIG. 9A.

Figure 12:
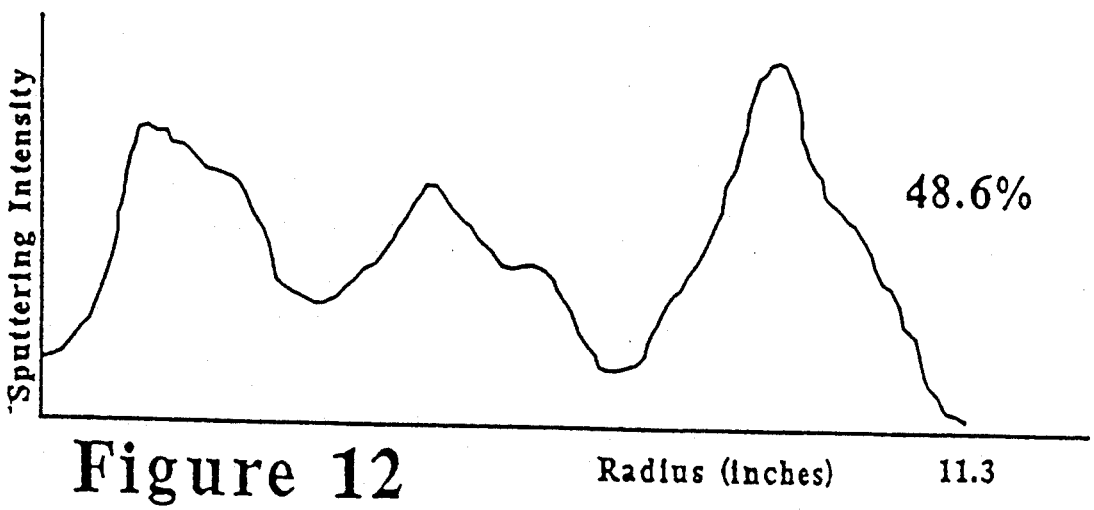
FIG. 12 illustrates the actual sputtering distribution $S_a(\rho_t)$ produced by the system of FIGS. 9A, 9B and 10 for an 11.3" target.

The electrons are trapped within a track (indicated by dashed centerline 918) that is located within a gap 919 formed between the two pole pieces. The width of gap 919 is substantially constant so that the electron trapping properties are substantially constant around the entire electron trap region. In FIG. 9A it can be seen the gap 919 covers rotation axis A so that sputtering of the target occurs at the center of the target as well. This increases the sputtering intensity in region 81 of FIG. 8. The actual sputtering distribution $S_a(\rho_t)$ produced by the system of FIGS. 9A-9E and 10 is illustrated in FIG. 12. It should be noted that some sputtering occurs at all points of the target. This is important for avoiding the formation of thin backsputtered regions that flake off and produce particulates that can deposit on the wafer.

The ability to produce the pole piece cross-section illustrated in FIG. 9A is provided by the overall structure of the pole pieces and magnets. This structure is illustrated in FIGS. 9A-9E. FIG. 9C is a parallel cross-section that intersects magnetron 90 at an elevation that passes through the magnets. This view illustrates the locations of magnets 913 within the magnetron. These magnets are positioned in a groove 914 machined into the bottom of outer pole piece 92. The primary purpose of the groove is to assure that the tops of the magnets are all at a uniform height. Because the pole pieces are a strongly ferromagnetic material such as magnetic grades of stainless steel, the magnetic attraction between the outer pole piece 92 and magnets 913 bond the magnets quite rigidly to the bottom of this groove. However, as illustrated in FIG. 9D, to ensure centering of the magnets within the outer pole piece when the magnetron is rotated by motor 95, incompressible, nonmagnetic material 917 such as nylon is included between magnets 913 and the sidewall of outer pole piece 92 to ensure substantial lateral centering of magnets 913 within outer pole piece 92. It is important to center magnets 913 between the sidewalls of outer pole piece 92 so that the magnetic field strength is substantially constant along the entire length of trap region 918 to produce substantially uniform ion generation within this trap region.

This particular pair of pole pieces has roughly the shape of a three. Because of the rotation of these pole pieces, a bridge 915 is included between the tips of the number three to provide structural strength to the outer pole piece. A plate 916 is attached to the outer pole piece to enable mounting of this pole piece to motor mounting plate 94.

FIG. 9D is a perpendicular cross-sectional view along the cut indicated in FIG. 9C. This view illustrates that the outer pole piece 92 is bowl-shaped with a rim 921 that is substantially coplanar with the inner pole piece 91. Between rim 921 and inner pole piece 91 is a gap 919 that has a substantially constant width.

This view also illustrates the structural advantages that enable these pole pieces to provide a strong magnetic field much closer to the outer perimeter of the target. The separation between the trap region and sidewall 77 of the magnetron is on the order of the thickness of the sidewalls of outer pole piece 92 plus about half the width of the gap between magnet 93 and the sidewall of the outer pole piece. Since this distance is typically much less than the minimum distance D of the embodiment in FIG. 7, the outermost groove 99 can be much closer to the perimeter of the target than can be achieved by the embodiment of FIG. 7.

Figure 7:
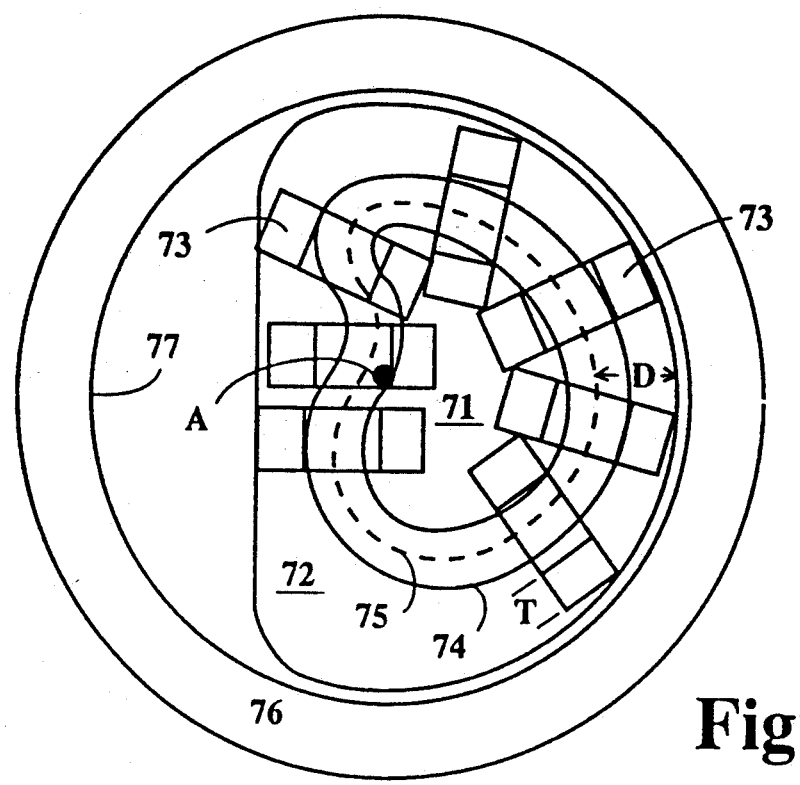
FIG. 7 is a top view of a prior art magnetron assembly having pole pieces that produce highly uniform sputtered coating thickness and excellent step coverage and step coverage uniformity.

This structural configuration also enables a greater amount of ferromagnetic material to be included in the magnetron than in the embodiment of FIG. 7. This increases the magnetic field strength in the trap region, thereby increasing the effectiveness of electron trapping. This increases the electron concentration in the gap and therefore also increases the amount of ionization produced by the trapped electrons.

FIG. 9E is a parallel cross-sectional view that passes through a cover plate 920. The cavity within which the pole pieces rotate is typically filled with water to facilitate thermal transfer from the target through the backing plate into the cooling water. Because the magnets would be corroded by such water, it is important to provide a water-tight environment for the magnets. This is achieved by attaching a faceplate 920 onto the top edge of the sidewalls of the outer pole piece. A ferromagnetic grade of stainless steel is used for the outer pole piece and a nonmagnetic grade of stainless steel is used for the faceplate.

Each of magnets 913 is preferably an ultra strong rare earth magnet, such as a neodymium-iron-boron magnet or a samarium-cobalt magnet, so that a particularly strong magnetic field is produced. A strong magnetic field is advantageous because it provides improved trapping of electrons, thereby improving the generation of ions in these trap regions. However, aside from the particular type of magnet utilized, a comparison of FIGS. 9C and 7 illustrate that a much greater number of magnets can be utilized in the embodiment of FIG. 9 that can be used in the embodiment of FIG. 7. The bowl-shaped outer pole piece enables the use of bar magnets instead of horseshoe magnets, thereby enabling a much greater density of magnetic material between the two pole pieces.

Wafer diameters are typically 100, 125, 150 or 200 mm and target diameters range from 250 mm for the 100 mm diameter wafer to 325 mm for the 200 mm diameter wafer. The spacing D between the wafer and target is typically in the range 35 mm to 55 mm.

The actual sputtering intensity profile produced by this magnetron is illustrated in FIG. 12. Because the outermost peak is the deepest and because it occurs at the greatest distance from the axis of rotation, even a small amount of outward radial positioning of this peak produces a significant increase in target utilization. This can be seen by noting that the intensity profile in FIG. 12 produces a 48.6% target utilization as compared to the 34.6 target utilization (illustrated in FIG. 8) produced by the pole pieces of FIG. 7. This represents a 40% increase in target utilization. Target utilization represents the percentage of target material sputtered compared to the maximum amount which would be sputtered with uniform erosion.

Figure 8:
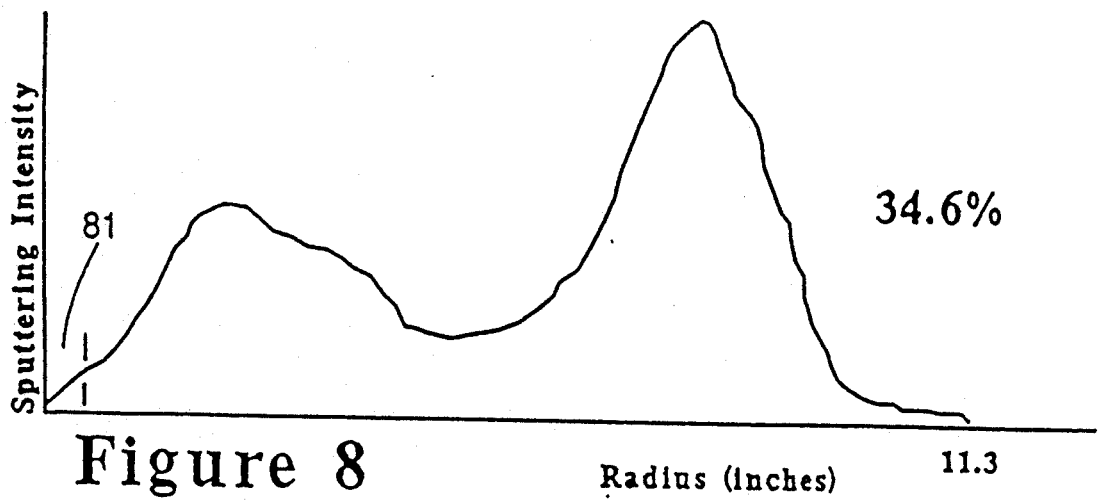
FIG. 8 illustrates the actual sputtering intensity distribution produced by the magnetron of FIG. 7.
Figure 13:
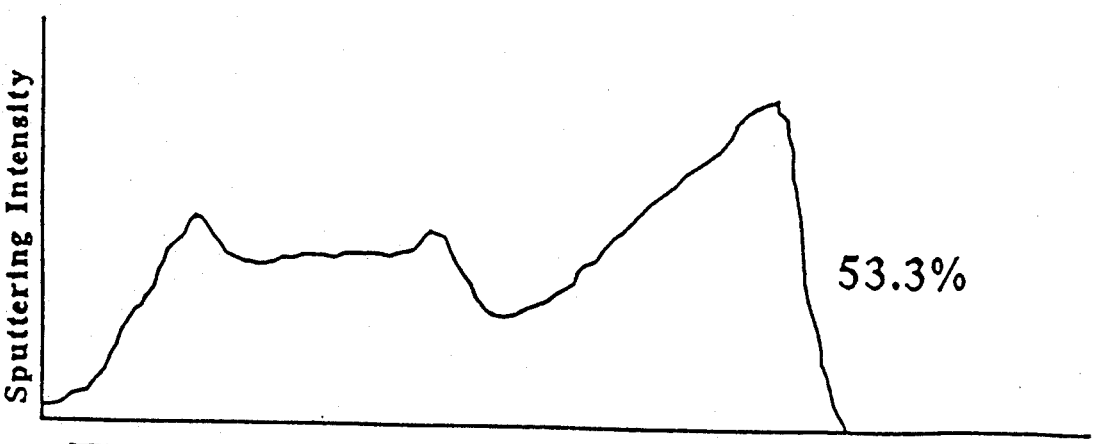
FIG. 13 illustrates the actual sputtering distribution $S_a(\rho_t)$ produced for an 10" target produced by an alternate embodiment of FIG. 9A that is illustrated in FIG. 14.

FIGS. 8 and 12 present data for the case of 11.3" targets. FIG. 13 illustrates the sputtering intensity profile and the target utilization that results for a 10" target for pole pieces as in the alternative embodiment illustrated in FIG. 14. The 53.3% target utilization represents a 54% improvement over that in FIG. 8.

Another advantage of this structural configuration is a trap region can be produced having sharper bends that can be produced by the prior embodiment of FIG. 7. This enables the production of three sputtering peaks instead of the two peaks of the embodiment of FIG. 7. This also enables greater flexibility in selection of the shape of the inner pole piece.

Figure 6A:
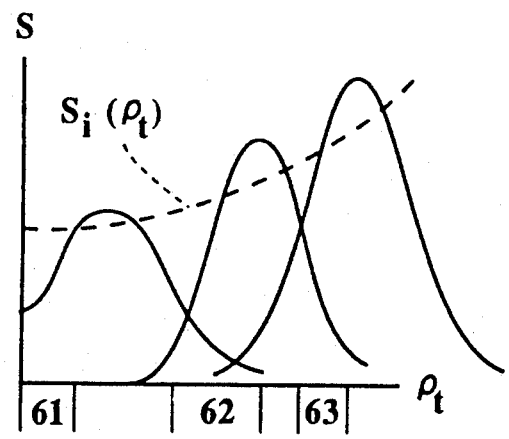
FIGS. 6A and 6B illustrate the approximation of the ideal radial dependence of sputtering achieved by sputtering grooves of controlled depth, width and location.
Figure 6B:
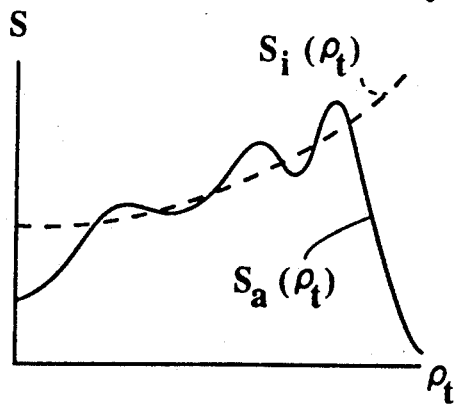

The parallel cross-sectional shape of the pole pieces need not be in the shape of the number three. This particular shape was chosen because it produces three sputtering peaks that substantially optimize coating thickness uniformity, step coverage and step coverage uniformity. However, pursuant to the analysis presented above, the shape of the inner pole piece is selected to produce a sputtering intensity distribution that approximates the ideal distribution $S^i(\rho t)$ presented in FIGS. 6A and 6B.

Figure 14:
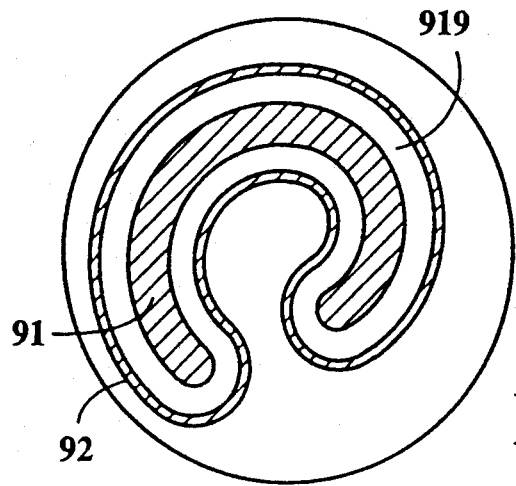
FIG. 14 is a view, analogous to that in FIG. 9A, for an alternate embodiment of the magnetron pole pieces.

The actual distribution $S^a(\rho t)$ is determined by the radial distribution of the trap region. A plot of the fraction of trap region that is located at a distance $\rho_t$ from rotation axis A is substantially equal to $S_a(\rho_t)$ so that, when the pole pieces are rotated about axis A, a circularly symmetric sputter pattern is produced that is substantially equal to $S_a(\rho_t)$. An alternate shape for the pole pieces is illustrated in FIG. 14. These pole pieces produce a gap having the shape of a pair of partial spirals that are connected together at both ends.

I claim:

1. A sputtering system for sputtering particles from a target onto a wafer, said sputtering system comprising:
   a reactor that encloses a vacuum chamber in which said target and wafer are to be placed;
   means for producing an electric field substantially perpendicular to the target to accelerate ions into the target to sputter particles from the target;
   a planar ferromagnetic inner pole piece;
   a ferromagnetic outer pole piece that is bowl-shaped in a perpendicular cross-section and has a rim that is substantially coplanar with the inner pole piece and that encircles the inner pole piece to produce between these two pole pieces a gap;
   means for producing a magnetic field across the gap between these two pole pieces; and
   means for rotating these pole pieces at a common rotation rate about an axis A that is substantially perpendicular to a plane containing said pole pieces and on which said wafer is to be centered perpendicular to this axis;
   said gap having the shape of a single closed loop.

2. A sputtering system as in claim 1 wherein said gap has a shape such that any circle of circumference $2\pi\rho_t$ centered on axis A, has substantially a fraction $S_f(\rho_t)$ of its circumference located within said gap, whereby, during sputtering of a target in a sputtering system utilizing these inner and outer pole pieces, a depth of sputter is produced that, as a function of radius $\rho_t$, is substantially equal to $S_f(\rho_t)$.

3. A sputtering system as in claim 2 wherein the gap has the shape of a number three.

4. A sputtering system as in claim 2 wherein said gap has the shape of a pair of nonintersecting partial spirals that are connected at both ends of the spirals.

5. A sputtering system as in claim 2 wherein the shape of said gap consists of a plurality of arcs, each having a constant radius of curvature, connected in series to form a single closed path.

6. A sputtering system as in claim 1 wherein said gap has a substantially constant width.

7. A sputtering system as in claim 1 wherein said gap intersects said rotation axis A, whereby the center of the wafer is significantly sputtered.

8. A sputtering system as in claim 1 wherein said means for producing a magnetic field across the gap comprises at least one rare earth magnet, whereby an increased efficiency of trapping is achieved.

9. A sputtering system as in claim 1 wherein said means for producing a magnetic field across the gap comprises at least one bar magnet, whereby an increase density of magnetic material is produced in between the pole pieces.

10. A sputtering system as in claim 1 further comprising a faceplate hat is attached to the outer pole piece to produce a watertight enclosure about the means for producing a magnetic field.

11. A sputtering system for sputtering particles from a generally planar target onto a substrate, the system comprising:
    a vacuum chamber containing the target and means for mounting the substrate;
    means for producing an electric field substantially perpendicular to the target to accelerate ions into the target and thereby sputter particles from the surface of the target;
    means for producing a magnetic field parallel to and immediately adjacent to the sputtering surface of the target, and generally perpendicular to a predetermined closed-loop path in a plane parallel to the target, wherein the path forms a single electron trap region that enhances plasma formation; and
    means for rotating the means for producing the magnetic field, about an axis substantially perpendicular to the target and the substrate, to provide a rotationally symmetrical sputtering intensity distribution;
    wherein the means for producing the magnetic field includes an outer magnetic pole piece having a relatively thin continuous sidewall, which permits the electron trap region to extend from the center of the target to a point separated from its perimeter by a distance determined principally by the thickness of the sidewall.

12. A sputtering system as defined in claim 11, wherein:

the outer magnetic pole piece is formed as a channel member with a generally U-shaped cross section; and the means for producing the magnetic field further includes an inner magnetic pole piece surrounded by the wall of the outer pole piece, and a plurality of magnets located in the channel member and coupled to the outer and inner pole pieces; whereby the channel member may be located in part at the perimeter of the target.

13. A sputtering system as defined in claim 11, wherein:

the outer magnetic pole piece is formed as a curvilinear channel member having a generally U-shaped cross section with closed ends, and the continuous sidewall has a single coplanar edge;

the means for producing the magnetic field further includes an inner planar magnetic pole piece, narrower than the width of the channel member, coplanar with and completely surrounded by the edge of the outer pole piece sidewall, thereby forming a single continuous gap between the two pole pieces, and a plurality of magnets located in the channel member, to provide a magnetic field across the gap, the center of which conforms with the predetermined path;

whereby the degree to which the gap forming the electron trap region can approach the target perimeter is limited by the thickness of the wall of the channel member.

14. A sputtering system as defined in claim 13, wherein:

the means for producing the magnetic field further includes a plurality of nonmagnetic spacers installed between the magnets and the wall of the channel member, to ensure centering of the magnets and a practically uniform gap.

15. A sputtering system as defined in claim 14, wherein:

the magnets are bar magnets, and are placed in close proximity to each other to provide as strong a magnetic field as possible.

16. A sputtering system as defined in claim 13, wherein:

the gap forming the electron trap region is configured to provide an ideal sputtering rate distribution that results in a substantially uniform effect on the substrate.

17. A sputtering system as defined in claim 16, wherein:

the proportion of the gap positioned at each radial distance from the axis of rotation is selected to conform with the ideal sputtering rate distribution.

18. A sputtering system as defined in claim 17, wherein:

the gap follows the outline of a thickened number three.

19. A sputtering system as defined in claim 16, wherein:

the gap has the shape of a pair of nonintersecting partial spirals that are connected at both ends of the spirals.

20. A sputtering system as defined in claim 16, wherein:

the shape of the gap consists of a plurality of arcs, each having a constant radius of curvature, connected in series to form the path.

21. A sputtering system as defined in claim 20, wherein:

there are at least three arcs of constant radius in the path.

22. A sputtering system as defined in claim 13, and further comprising:

a faceplate that is attached to the outer pole piece to produce a watertight enclosure about the means for producing the magnetic field.

* * * * *